(12) United States Patent
Lee et al.

(10) Patent No.: US 7,196,006 B2
(45) Date of Patent: Mar. 27, 2007

(54) MANUFACTURING METHOD FOR MICROELECTRONIC DEVICE

(75) Inventors: Pey-Yuan Lee, Sinshin Township, Tainan County (TW); Feng-Liang Lai, Jial Township, Tainan County (TW); Cheng-Kuo Chu, Tainan (TW); Chi-Shen Lo, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 7 days.

(21) Appl. No.: 10/822,960

(22) Filed: Apr. 13, 2004

(65) Prior Publication Data

US 2005/0224995 A1  Oct. 13, 2005

(51) Int. Cl.
*H01L 21/4763* (2006.01)
(52) U.S. Cl. .................... 438/648; 438/14; 438/656
(58) Field of Classification Search ............... 438/14, 438/648, 656
See application file for complete search history.

(56) References Cited

U.S. PATENT DOCUMENTS

| | | | |
|---|---|---|---|
| 5,520,769 A * | 5/1996 | Barrett et al. ............... | 438/14 |
| 5,926,738 A * | 7/1999 | Cronin et al. ............... | 438/688 |
| 6,038,015 A * | 3/2000 | Kawata ....................... | 355/67 |
| 6,329,826 B1 * | 12/2001 | Shinada et al. ............. | 324/751 |
| 6,355,516 B1 * | 3/2002 | Kim et al. ................... | 438/240 |
| 6,403,385 B1 * | 6/2002 | Venkatkrishnan et al. .... | 438/14 |
| 6,410,927 B1 * | 6/2002 | Pike ........................ | 250/491.1 |
| 6,512,227 B2 * | 1/2003 | Iwabuchi et al. ........... | 250/310 |
| 6,525,318 B1 * | 2/2003 | Kim et al. ................... | 250/310 |
| 6,664,196 B1 * | 12/2003 | Wada et al. ................. | 438/754 |
| 6,841,008 B1 * | 1/2005 | Branco et al. ............... | 134/26 |
| 6,900,135 B2 * | 5/2005 | Somekh et al. ............. | 438/704 |
| 6,920,241 B1 * | 7/2005 | Dutta-Choudhury et al. ........................ | 382/141 |
| 6,939,726 B2 * | 9/2005 | Hsu et al. .................... | 438/14 |

FOREIGN PATENT DOCUMENTS

JP 63244748 A * 10/1988

\* cited by examiner

*Primary Examiner*—Andy Huynh
(74) *Attorney, Agent, or Firm*—Haynes and Boone, LLP

(57) ABSTRACT

A method of manufacturing a microelectronic device, including performing a first inspection of a device feature during an intermediate stage of manufacture, cleaning the device feature after the first inspection, and performing a second inspection of the device feature after cleaning the device feature.

16 Claims, 4 Drawing Sheets

CARRYOVER REDUCTION IN MULTIPLE CDSEM AEI CD LINE MATCHING

CARRYOVER REDUCTION IN MULTIPLE CDSEM AEI CD LINE MATCHING

MANUFACTURING METHOD FOR MICROELECTRONIC DEVICE

BACKGROUND

The present disclosure relates generally to microelectronic device manufacturing methods, and more specifically to a method and device for maintaining manufacturing equipment operation quality.

An integrated circuit (IC) is formed by creating one or more devices (e.g., circuit components) on a semiconductor substrate using a variety of fabrication process. As fabrication processes and materials improve, semiconductor device geometries continue to decrease in size. For example, current fabrication processes are producing devices having geometry sizes (e.g., the smallest component (or line) that may be created using the process) that are less than 65 nm. However, the reduction in size of device geometries frequently introduces new challenges to maintaining device quality, reliability, and performance.

For example, as device geometries shrink, the methods of measurement employed by metrology equipment require strict procedures to maintain the quality and reliability of manufactured products. Moreover, processes and apparatus employed during such measurements can introduce contaminates to the product which can result in erroneous measurements and adversely affect calibration of metrology equipment.

Accordingly, what is needed in the art is a method and device thereof that addresses the above discussed issues.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
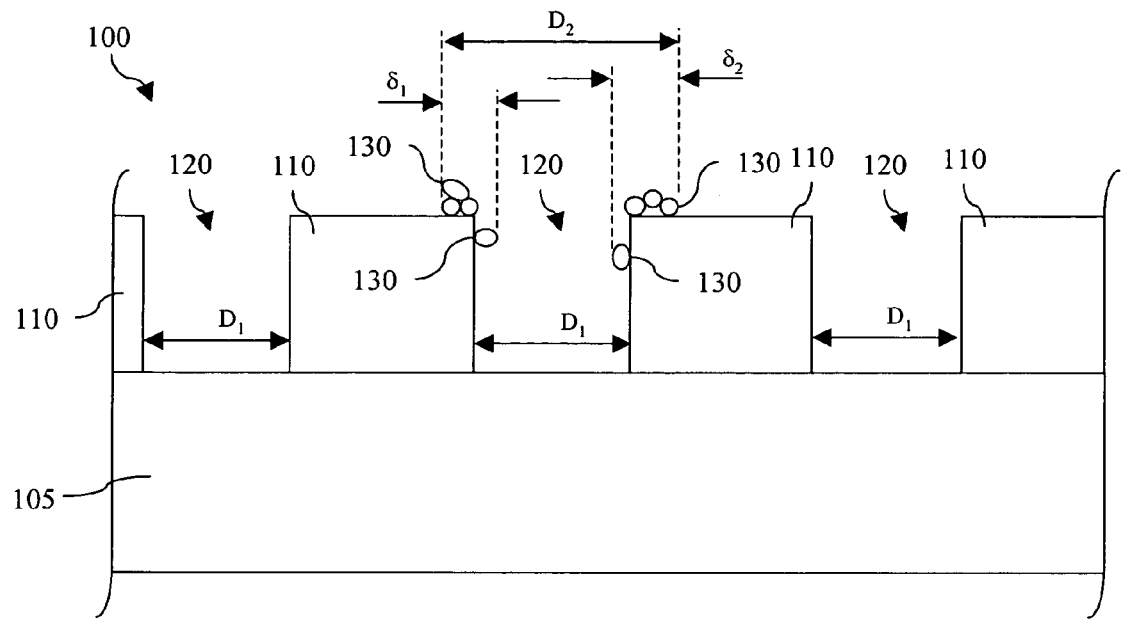
FIG. 1 illustrates a sectional view of a microelectronic device in an intermediate stage of manufacture according to aspects of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring to FIG. 1, illustrated is a sectional view of a microelectronic device 100 which may be inspected by metrology apparatus according to aspects of the present disclosure. The microelectronic device 100 includes features 110 formed over a substrate 105. Such features 110 may comprise trenches, conductive lines, and other features employed in integrated circuit devices. Examples of microelectronic components which may be formed by the features 110 include memory cells/arrays, transistors, capacitors, inductors, transformers, electrodes, contacts, vias, interconnects, traces, shallow trench isolation and other isolative structures, spacers, and other components which may be formed by one or more layers of conductive, semi-conductive, and/or insulating materials and patterns, recesses, and openings formed therein. In the illustrated embodiment, the features 110 comprise conductive lines formed over the substrate 105 and separated by trenches 120. Each of the features 110 shown in FIG. 1 also contemplates multiple features 110. The features 110 may be formed by immersion photolithography, maskless lithography, chemical-vapor deposition (CVD), plasma-enhanced CVD (PECVD), physical-vapor deposition (PVD), atomic layer deposition (ALD), and/or other conventional and/or future-developed lithographic, etching, and/or other processes.

Although not limited by the scope of the present disclosure, the substrate 105 may be or comprise a silicon-on-insulator (SOI) substrate and/or a polymer-on-silicon substrate, and may comprise silicon, gallium arsenide, gallium nitride, strained silicon, silicon germanium, silicon carbide, carbide, diamond, and/or other materials. The substrate 105 may also include a fully depleted SOI substrate, wherein an active device layer thickness may range between about 500 angstroms and about 2000 angstroms. The substrate 105 may also include, or the features 110 may form, a plurality of microelectronic devices which may include electrically programmable read only memory (EPROM) cells, electrically erasable programmable read only memory (EEPROM) cells, static random access memory (SRAM) cells, dynamic random access memory (DRAM) cells, single electron transistors (SET), and/or other microelectronic devices (hereafter collectively referred to as microelectronic devices). Such devices and/or the features 110 may have dimensions ranging between about 1 angstrom and about 2000 angstroms. In one embodiment, all or a substantial portion of such dimensions may be less than about 1300 angstroms.

At intermediate stages of manufacture, or after the microelectronic device 100 is complete, the features 110 may be inspected. Such inspection may employ scanning electron microscopy (SEM), optical imaging comparison, energy-dispersive x-ray (EDX), Auger electron spectroscopy (AES), secondary ion mass spectroscopy (SIMS), acoustical reflectometry, and/or other methods of measurement possibly having sub-micron resolution. The inspection may also employ a multiple purpose tool which includes a plurality of metrological equipment, such as the $^{AIT}$Fusion UV™ (a product of KLA-Tencor of San Jose, Calif.), the eCD-1 sub-90 nm design rule CD SEM (a product of KLA-Tencor of San Jose, Calif.), and/or other metrology equipment.

However, such metrology methods can generate and/or dislodge carbon particles and other contaminates (hereafter collectively referred to as contaminates) 130. As shown in FIG. 1, the contaminates 130 may adhere to the sides of the trenches 120 and/or collect proximate the edges of the features 110 (among other locations). Consequently, inspection of a distance $D_1$ between the features 110 may be inaccurate. For example, measurement via SEM may indicate that the features 110 are separated by a distance $D_2$. As indicated in FIG. 1, the measured distance $D_2$ may vary from the actual distance $D_1$ by an amount equal to $\delta_1+\delta_2$, wherein $\delta_1$ and $\delta_2$ may depend on the size and amount of the contaminates 130.

Figure 2:
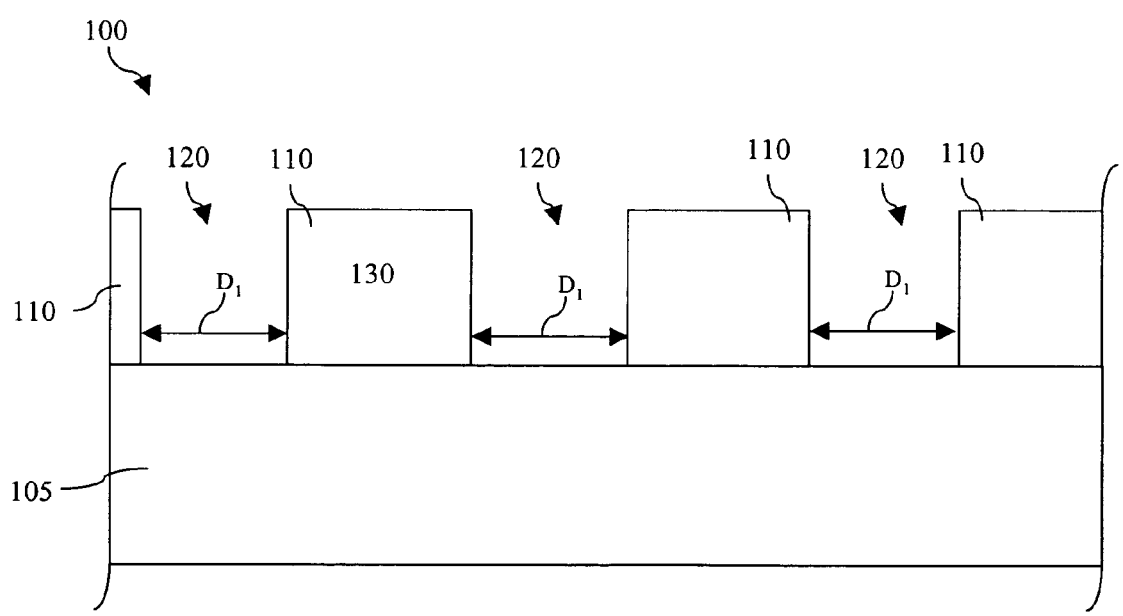
FIG. 2 illustrates a sectional view of the microelectronic device shown in FIG. 1 in a subsequent stage of manufacture.

Referring to FIG. 2, illustrated is a sectional view of the device 100 shown in FIG. 1 in a subsequent stage of manufacture, in which the device 100 has undergone a cleaning process to remove the contaminates 130, such that subsequent measurement of the features 110 may be accurate. The cleaning process may comprise exposure to a chemical and/or plasma processing environment. For example, the contaminates 130 may be removed by a plasma clean employing $O_2$, perfluorocarbons, Ar, He, H, and/or other gases. Plasma ions created in the plasma may interact with the contaminates 130 to form effluents, thus removing the contaminates 130. The cleaning process may also or alternatively include one or more chemical etch processes employing hydrofluoric (HF) acid, hydrogen peroxide ($H_2O_2$), sulfuric acid ($H_2SO_4$), deionized water (DI water), and/or other etchant chemistries. The cleaning process may also include rinsing with DI water and/or other cleaners. The cleaning process may be performed by dipping the device 100 in an etchant, applying the etchant to the device 100, exposing the device 100 to a vapor or other cleaning environment, or by other methods.

Figure 3:
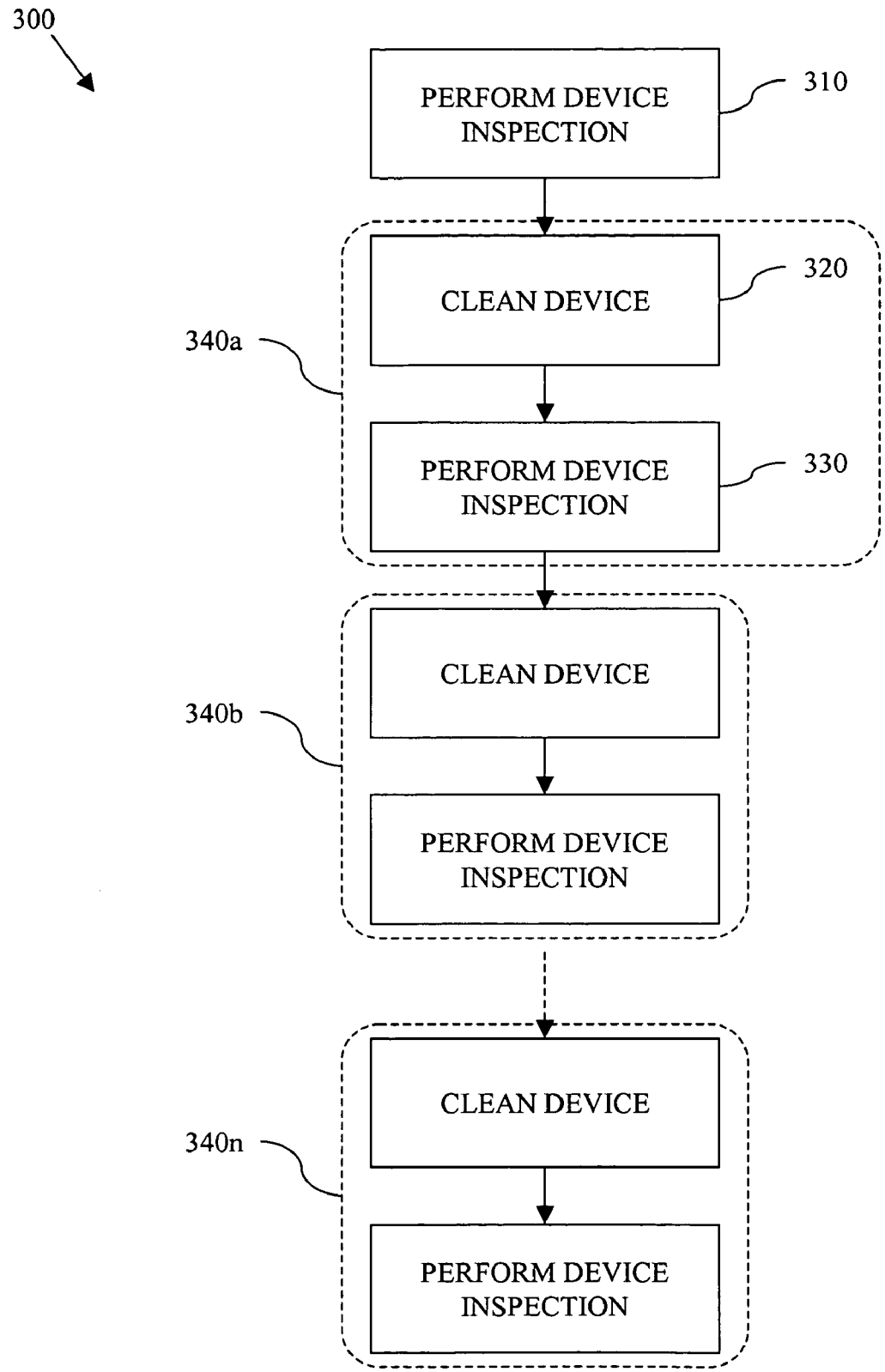
FIG. 3 illustrates a block diagram of one embodiment of an inspection method according to aspects of the present disclosure.

Referring to FIG. 3, illustrated is a flow chart diagram of a microelectronic device manufacturing method 300 according to aspects of the present disclosure. The method 300 may be employed during and/or after manufacturing of a microelectronic device, such as the device 100 described above. The method 300 may also be employed during the calibration of metrology equipment, as described below.

The method 300 includes a step 310 in which a microelectronic device, or a portion thereof, is inspected. Such inspection may employ scanning electron microscopy (SEM), optical imaging comparison, energy-dispersive x-ray (EDX), Auger electron spectroscopy (AES), secondary ion mass spectroscopy (SIMS), acoustical reflectometry, and/or other methods of measurement, including but not limited to those having sub-micron resolution. The inspection may be performed to determine line widths of various features formed on the microelectronic device, such as the features 110 of the device 100 shown in FIGS. 1 and 2. The inspection may also be performed to determine other parameters of the microelectronic device or features thereof, including step heights, material compositions, distances, trench widths, and/or other parameters. In one embodiment, the inspection is performed to determine a critical dimension (CD) employing SEM. Such a process may be referred to herein as CDSEM.

The method 300 also includes a step 320 in which the microelectronic device, or a portion thereof, is cleaned after the inspection performed in the step 310. The cleaning performed in the step 320 may comprise exposing the microelectronic device to a chemical and/or plasma processing environment. In one embodiment, the cleaning performed during the step 320 comprises a plasma clean employing $O_2$, perfluorocarbons, Ar, He, H, and/or other gases. The cleaning process of step 320 may also or alternatively include one or more chemical etch processes, possibly employing hydrofluoric (HF) acid, hydrogen peroxide ($H_2O_2$), sulfuric acid ($H_2SO_4$), deionized water (DI water), and/or other etchant chemistries, optionally in conjunction with a DI water and/or other cleaner rinse. The cleaning process may be performed by dipping the microelectronic device in an etchant, applying the etchant to the device, exposing the device to a vapor or other cleaning environment, and/or by other methods.

The next step 330 in the method 300 comprises examining the microelectronic device after initial examination in step 310 and the cleaning performed in step 320. This subsequent examination may be substantially similar to the initial examination performed during step 310. For example, the examination performed during steps 310 and 330 may be performed to determine the same parameter of a feature of the microelectronic device. In one embodiment, the examination performed during steps 310 and 330 may be performed in the same examination apparatus—for example, within the same chamber of a scanning electronic microscope. However, in another embodiment, the examination performed during step 330 may be performed in a different chamber or tool than that in which the examination of step 310 is performed.

The steps 320 and 330 may be repeated as necessary during the manufacture of a microelectronic device or the calibration of metrology equipment. Thus, the method 300 includes a method 340a comprising steps 320 and 330, and possibly other steps. The method 340a may be repeated as method 340b through 340n. The methods 340a–n may individually be performed within separate or common chambers or metrology apparatus. For example, a microelectronic device may be initially examined in a first SEM tool employing methods 300 and/or 340a and subsequently examined in a second, different SEM tool employing method 340b (or method 340c, 340d, etc.). In another example, a microelectronic device may be initially examined in an SEM tool employing methods 300 and/or 340a and subsequently examined in an AES tool employing method 340b. In another example, a microelectronic device may be initially and subsequently examined in a single SEM tool by methods 340a, 340b . . . .

As described above, the method 300 and/or portions thereof may be employed during the calibration of metrology equipment. For example, in one embodiment, a calibrating wafer having one or more features formed thereon and/or therein is inspected with a metrology apparatus. The calibration wafer features may be precisely formed and/or previously inspected, such that feature parameters inspected during use of the method 300 or portions thereof for calibration may be known prior to performing the calibration. in one embodiment, the calibration wafer is a portion of a production wafer. For example, a production wafer may comprise a plurality of devices, integrated circuits, chips, etc. in a central or otherwise substantial portion of the wafer, and a smaller portion may be reserved for calibration purposes. In one embodiment, the calibration wafer may be a production wafer without a region reserved for calibration purposes, wherein the production devices, circuits, and/or features thereof may be inspected during the calibration method.

The calibration wafer may then be inspected, such as by performing step 310 shown in FIG. 3. However, as discussed above, inspection with some metrology equipment can cause residue or contaminates to collect on portions of the calibration wafer, such that continued or subsequent inspections may be inaccurate. Consequently, the calibration method may also include step 320, in which the calibration may be cleaned by one or more of the cleaning processes described above. The calibration wafer may then be inspected a second time, as shown in step 330 in FIG. 3. The second inspection may be performed by the same metrology apparatus as employed to perform the initial inspection. In another embodiment, the second inspection may be performed by a different piece of metrology apparatus. The results (e.g., measurements) of the second inspection may be compared to the results of the first inspection to determine the calibration of the apparatus employed to perform the first and/or second inspections. The calibration method may also repeat steps 320 and 330 (or method 340a) as necessary to verify and/or adjust the calibration of the apparatus employed to perform the first and/or second inspections (and possibly subsequent inspections).

Figure 4:
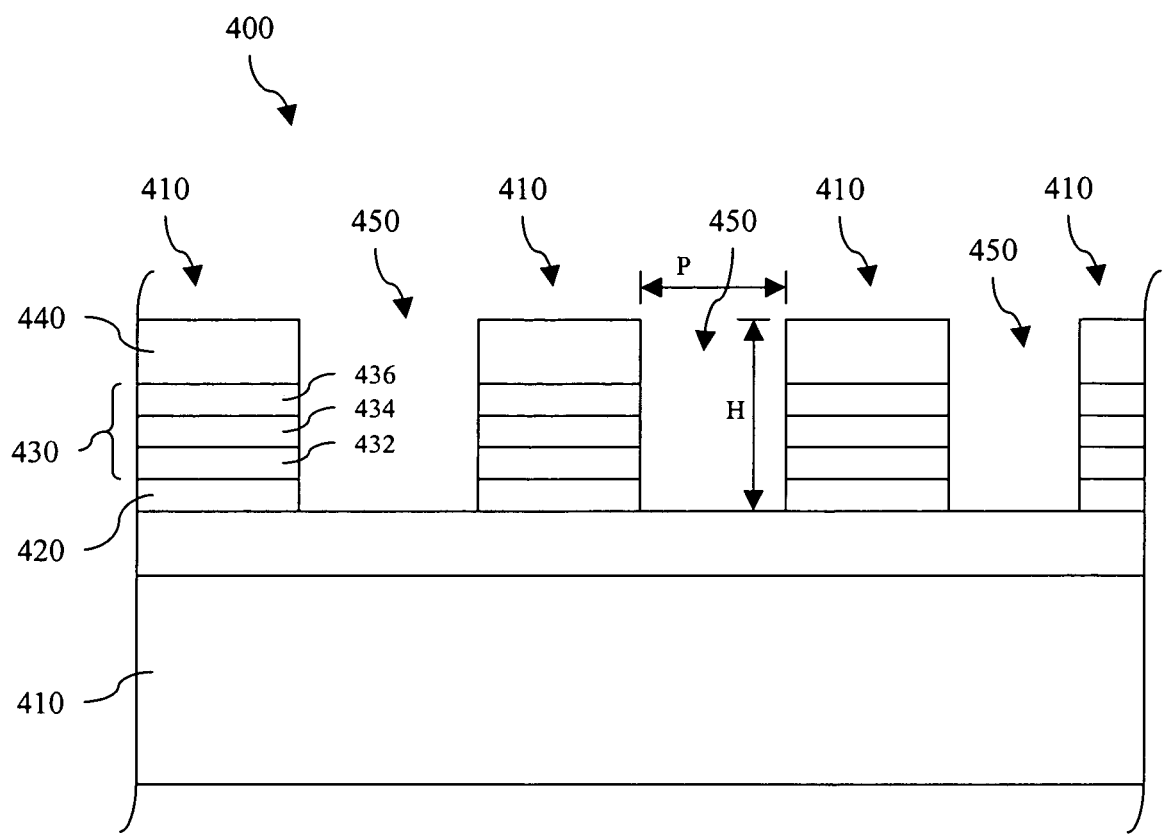
FIG. 4 illustrates a sectional view of one embodiment of a calibration device constructed according to aspects of the present disclosure.

Referring to FIG. 4, illustrated is a sectional view of one embodiment of a portion of a calibration device 400 constructed according to aspects of the present disclosure. The calibration device 400 may be employed during the calibration of the various metrology equipment, including but not limited to those discussed above. For example, the calibration device 400 may be employed with the method 300 shown in FIG. 3 to calibrate an SEM or other metrology tool.

The calibration device 400 may include a plurality of features 410 formed over, on, and/or at least partially within a substrate 405 and having a myriad of characteristically different geometric dimensions. The substrate 405 may comprise Si, SiGe, SOI, SON, diamond, SiC, polymer, and/or other materials. In one embodiment, the substrate 405 may include a p-type Si substrate with a resistance ranging between about 6 Ωcm and about 16 Ωcm.

The features 410 may have dimensions ranging between about 3 angstroms and about 5000 angstroms, and may also have a pitch P (spacing between features) ranging between about 100 angstroms and about 1800 angstroms, such that trenches or other openings 450 separating the features 410 may have similar dimensions. The features 410 may include a plurality of conductive members fabricated by patterning, chemical etching, plasma etching, ion milling, and/or other processes. In one embodiment, the features 410 are formed by an ion beam, such as a focused ion beam (FIB), wherein Ge, Ga, Ar, N, He, and/or other ions may be employed to define the features 410 from one or more layers formed over the substrate 405 and/or directly from the substrate 405. The features 410 may comprise W, Cu, Al, Ti, TiN, Ta, TaN, WN, TiW, AlCu, $SiO_2$, $Si_3N_4$, polymers, alloys, carbon nanotubes, combinations thereof, and/or other materials.

In the illustrated embodiment, the features 410 are defined from a plurality of layers 420, 430, 440, such as by FIB and/or other processes. The composition, formation, and/or patterning of the layers 420, 430, 440 may be adapted for the prevention and/or reduction of formation and/the accumulation of contaminates on or proximate the features 410.

The layer 420 may comprise a conductive material, possibly adapted for the dissipation of charge during SEM measurement. The layer 420 may comprise Al, Cu, W, Ti, TiN, Ta, TaN, doped polysilicon, AlCu alloys, and/or other materials. The layer 420 may have a thickness ranging between about 200 angstroms and about 10,000 angstroms, and may be formed by CVD, PECVD, PVD, ALD, and/or other processes.

The layer 430 may be a buffer conductive layer 430, and may include a plurality of layers 432, 434, and 436. The layer 430, and/or the layers 432, 434, 436, may comprise Al, Cu, W, Ti, TiN, Ta, TaN, doped polysilicon, AlCu alloys, and/or other materials. In one embodiment, the layer 432 may comprise TiN and have a thickness ranging between about 25 angstroms and about 500 angstroms, and may be formed by PVD, CVD, PECVD, ALD and/or methods. The layer 434 may comprise Ti, and may formed by ionized metal plasma (IMP) sputtering, CVD, ALD, and/or other methods. The layer 434 may have a thickness ranging between about 5 angstroms and about 200 angstroms. The layer 436 may comprise TiN, and may be formed by metal organic chemical vapor deposition (MOCVD), ALD, PVD, IMP, CVD, PECVD, and/or other methods. The formation of the layer 436 may include a metal organic precursor, such as tetrakisdimethlyamino titanium (TDMAT), tetrakisdiethlyamino titanium (TDEAT), titanium tetrachloride ($TiCl_4$), and/or other precursors. The formation of the layer 436 may also be immediately followed by nitrogen plasma densification to drive out carbon, thereby decreasing the layer 436 resistance. The layer 436 may have a thickness ranging between about 3 angstroms and about 75 angstroms.

The layer 440 may be a conductive layer, possibly comprising Al, Cu, W, Ti, TiN, Ta, TaN, doped polysilicon, AlCu alloys, and/or other materials. The layer 440 may have a thickness ranging between about 500 angstroms and about 10,000 angstroms, and may be formed by PECVD, PVD, ALD, CVD, and/or other methods.

Figure 5:
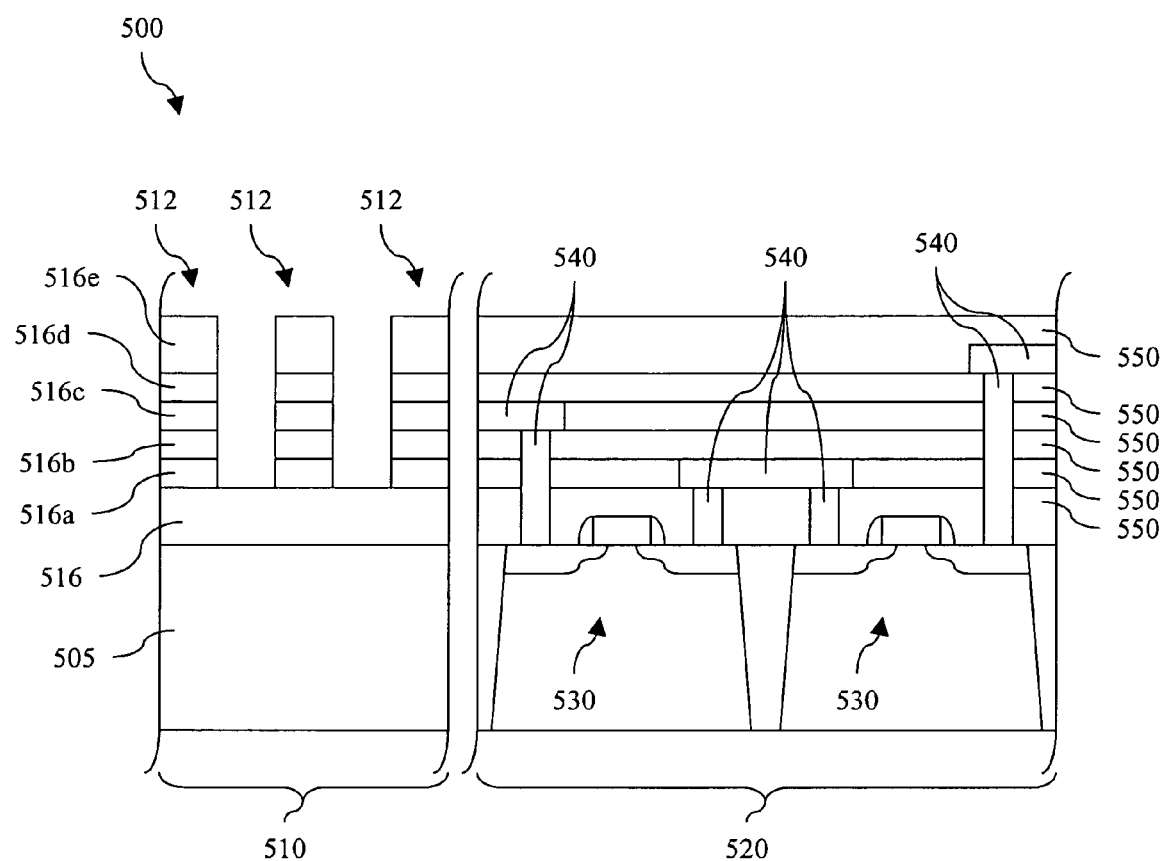
FIG. 5 illustrates a sectional view of one embodiment of a microelectronic device constructed according to aspects of the present disclosure.

Referring to FIG. 5, illustrated is a sectional view of one embodiment of a microelectronic device 500 constructed according to aspects of the present disclosure. The microelectronic device 500 is one environment in which aspects of the above-described calibration wafer 400 and/or the method 300 may be implemented. For example, the microelectronic device 500 may comprise a calibration region 510 similar to at least a portion of the calibration wafer 400 shown in FIG. 4. However, the microelectronic device 500 may also include a product region 520 in which transistors, memory cells, integrated circuits, and/or other passive and/or active microelectronic components may be formed. Thus, the microelectronic device 500 may include a common substrate 505 on, in, and/or over which the calibration region 510 and the product region 520 are formed. The substrate 505 may be a production wafer having a handle portion for transporting the device 500 among production and inspection equipment at various stages of manufacture, such as to performed the methods 300, 340a shown in FIG. 3.

The calibration region 510 may include a plurality of calibration features 512 defined in and/or over one or more layers 516 formed over the substrate 505. For example, the calibration features 512 may be defined in a plurality of layers 516a–e which may be substantially similar in composition and manufacture to the layers 420, 432, 434, 436, 440, respectively, shown in FIG. 4.

The production region 520 may include a plurality of microelectronic devices 530 located on or in the substrate 505. The microelectronic devices 530 may be interconnected and/or connected to one or more other microelectronic devices manufactured on or in the substrate 505. The microelectronic devices 530 may be or include metal-oxide-semiconductor field-effect-transistors (MOSFETs), FinFETs, and/or other conventional or future-developed semiconductor devices and/or microelectronic components. The microelectronic devices 530 may also include a plurality of features which may be employed during calibration performed within the scope of the method 300 shown in FIG. 3.

The production region 520 may also include interconnects 540 extending along and/or through one or more dielectric layers 550 to ones of the plurality of microelectronic devices 530. The dielectric layers 550 may comprise silicon dioxide, Black Diamond® (a product of Applied Materials of Santa Clara, Calif.), and/or other materials, and may be formed by CVD, PECVD, ALD, PVD, spin-on coating, and/or other processes. The dielectric layers 550 may have a thickness ranging between about 200 angstroms and about 15,000 angstroms.

The interconnects 540 may be formed by etching or otherwise patterning the dielectric layers 550 and subsequently filling the pattern with refractive and/or conductive material, such as tantalum nitride, titanium nitride, copper, and aluminum. In one embodiment, one or more of the interconnects 540 has a dual-damascene structure. The interconnects 540 may also comprise copper, tungsten, gold, aluminum, carbon nano-tubes, carbon fullerenes, refractory metals, and/or other materials, and may be formed by CVD, PECVD, ALD, PVD, and/or other processes.

One or more of the dielectric layers 550 and/or the interconnects 540 may be formed substantially simultaneously with the formation of one or more of the layers 516a–e. For example, the layers 516a and one or more of the interconnects 540, or the layers 516c and one or more of the interconnects 540, may be substantially similar in composition and manufacture. However, while ones of the layers 516a–e and the interconnects 540 are shown in FIG. 5 as being substantially coplanar, such alignment may not exist in all embodiments. For example, the calibration region 510 may be substantially or entirely completed prior to commencing or completing the formation of features located in the production region 520, such that any alignment between features or layers in the calibration region 510 and the production region 520 may be coincidental.

Thus, the present disclosure introduces a method of manufacturing a microelectronic device including, in one embodiment, performing a first inspection of a device feature during an intermediate stage of manufacture, cleaning the device feature after the first inspection, and performing a second inspection of the device feature after cleaning the device feature. The cleaning may comprise exposing the device feature to an oxygen-containing plasma between the first and second inspections, at least one of which may be performed by an SEM.

The present disclosure also provides a method of calibrating a metrology tool. In one embodiment, the calibration method includes inspecting a calibration feature, cleaning the inspected calibration feature, and re-inspecting the cleaned calibration feature. The results obtained during the inspection and re-inspection of the calibration feature may then be compared.

A calibration wafer is also introduced in the present disclosure. In one embodiment, the calibration wafer includes a first conductive layer located over a substrate, a buffer conductive layer located over the first conductive layer, and a second conductive layer located over the buffer conductive layer. A plurality of trenches are formed extending through the first, buffer, and second conductive layers, thereby defining a plurality of calibration features.

The present disclosure also provides a method of manufacturing a calibration wafer including, in one embodiment, forming a first conductive layer over a substrate, forming a buffer conductive layer over the first conductive layer, and forming a second conductive layer over the buffer conductive layer. A plurality of trenches are formed extending through the first, buffer, and second conductive layers, thereby defining a plurality of calibration features.

A microelectronic device introduced in the present disclosure includes, in one embodiment, at least one integrated circuit device located in a production region of a wafer and at least one calibration feature located in a calibration region of the wafer. The integrated circuit device includes a plurality of semiconductor devices located over the wafer and a plurality of interconnects located over and interconnecting ones of the plurality of semiconductor devices. The calibration feature includes a first conductive layer located over the substrate, a buffer conductive layer located over the first conductive layer, and a second conductive layer located over the buffer conductive layer. A plurality of trenches extend through the first, buffer, and second conductive layers, thereby defining the at least one calibration feature.

Although embodiments of the present disclosure have been described in detail, those skilled in the art should understand that they may make various changes, substitutions and alterations herein without departing from the spirit and scope of the present disclosure. Accordingly, all such changes, substitutions and alterations are intended to be included within the scope of the present disclosure as defined in the following claims. In the claims, means-plus-function clauses are intended to cover the structures described herein as performing the recited function and not only structural equivalents, but also equivalent structures.

What is claimed is:

1. A method of manufacturing a microelectronic device, comprising:
    performing a first inspection of a device feature during an intermediate stage of manufacture;
    cleaning the device feature after the first inspection; and
    performing a second inspection of the device feature after cleaning the device feature, wherein the device feature is located in a production region of a wafer, the wafer further including a calibration region having a calibration feature located therein;
    wherein the calibration feature comprises a first conductive layer located over the wafer, a buffer layer located over the first conductive layer, and a second conductive layer located over the buffer layer;
    wherein the first conductive layer comprises AlCu; and
    wherein the buffer layer comprises a first TiN layer over the first conductive layer, an implanted Ti layer over the first TiN layer, and a second TiN layer over the implanted Ti layer.

2. The method of claim 1 wherein the second conductive layer comprises W.

3. The method of claim 1 wherein at least one of the first and second inspections is performed by a scanning electron microscope (SEM).

4. The method of claim 1 wherein the cleaning comprises exposing the device feature to an oxygen containing plasma.

5. The method of claim 1 wherein the device feature comprises a first conductive layer located over a substrate, a buffer layer located over the first conductive layer, and a second conductive layer located over the buffer layer.

6. A method of manufacturing a microelectronic device, comprising:
    performing a first inspection of a device feature during an intermediate stage of manufacture;
    cleaning the device feature after the first inspection; and
    performing a second inspection of the device feature after cleaning the device feature, wherein the device feature is located in a production region of a wafer, the wafer further including a calibration region having a calibration feature located therein;
    wherein the calibration feature comprises a first conductive layer located over the wafer, a buffer layer located over the first conductive layer, and a second conductive layer located over the buffer layer;

wherein the second conductive layer comprises W; and wherein the buffer layer comprises a first TiN layer over the first conductive layer, an implanted Ti layer over the first TiN layer, and a second TiN layer over the implanted Ti layer.

7. The method of claim 6 wherein the first conductive layer comprises AlCu.

8. The method of claim 6 wherein at least one of the first and second inspections is performed by a scanning electron microscope (SEM).

9. The method of claim 6 wherein the cleaning comprises exposing the device feature to an oxygen containing plasma.

10. The method of claim 6 wherein the device feature comprises a first conductive layer located over a substrate, a buffer layer located over the first conductive layer, and a second conductive layer located over the buffer layer.

11. A method of manufacturing a microelectronic device, comprising:

performing a first inspection of a device feature during an intermediate stage of manufacture;

cleaning the device feature after the first inspection; and performing a second inspection of the device feature after cleaning the device feature, wherein the device feature is located in a production region of a wafer, the wafer further including a calibration region having a calibration feature located therein;

wherein the calibration feature comprises a first conductive layer located over the wafer, a buffer layer located over the first conductive layer, and a second conductive layer located over the buffer layer; and wherein the buffer layer comprises a first TiN layer over the first conductive layer, an implanted Ti layer over the first TiN layer, and a second TiN layer over the implanted Ti layer.

12. The method of claim 11 wherein the first conductive layer comprises AlCu.

13. The method of claim 11 wherein the second conductive layer comprises W.

14. The method of claim 11 wherein at least one of the first and second inspections is performed by a scanning electron microscope (SEM).

15. The method of claim 11 wherein the cleaning comprises exposing the device feature to an oxygen containing plasma.

16. The method of claim 11 wherein the device feature comprises a first conductive layer located over a substrate, a buffer layer located over the first conductive layer, and a second conductive layer located over the buffer layer.

* * * * *